INVENTORS
ROBERT D. CRIBBS
GEORGE E. VENZKE
ERNEST J. MOES
BY
ATTORNEYS

United States Patent Office 3,417,336
Patented Dec. 17, 1968

3,417,336
RECTIFIER FREQUENCY SHIFT KEYER (FSK) CONVERTER AND FILTER CIRCUIT

Robert D. Cribbs, Mount Vernon, George E. Venzke, Cedar Rapids, and Ernest J. Moes, Marion, Iowa, assignors to Collins Radio Company, Cedar Rapids, Iowa, a corporation of Iowa Filed May 7, 1965, Ser. No. 454,114
14 Claims. (Cl. 328—140)

ABSTRACT OF THE DISCLOSURE

A rectifier-filter circuit with at least one tuned subcircuit having dual A.C. signal output paths signal input coupled to the respective voltage doubler, of two, with each A.C. signal capacitor coupled to common output means and with one of the two doublers having a D.C. circuit signal output path in parallel with the A.C. signal output coupling capacitor of that doubler.

Figure 1:
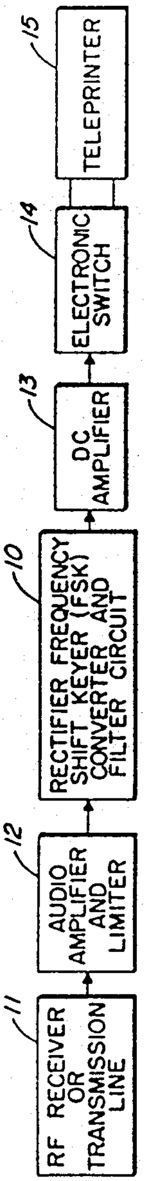

This invention relates in general to rectifier-filter circuits, and in particular, to a rectifier frequency shift keyer converter and filter circuit providing a square wave D.C. output without excessive A.C. ripple.

Combined discriminator and filter circuits heretofore have included a number of relatively simple circuits and some more complicated circuits. Generally, the simpler circuits have consisted of parallel tuned circuits for two shift keying tunes with each followed by a rectifier circuit and, in turn, an RC or LC filter. While this form of circuit has relatively few parts the square wave output either has excessive A.C. ripple due to insufficient filtering, or if the filtering factor is increased, the filtering time constant causes leading and trailing edges of the otherwise square wave output to be rounded off. This is a form of distortion known in teletype circles as bias distortion. Furthermore, the problem of excessive A.C. ripple is quite likely to cause false triggering of the D.C. amplifier. A relatively complicated circuit having relatively low bias distortion and better noise balancing than with the simpler circuits includes, as an example, 4 transformers, 6 transistors, and many diodes, resistors, and capacitors. What was needed, actually, was a rectifier-filter circuit capable of taking two different A.C. tuned frequency inputs from a discriminator, converting the signals to D.C., filtering out practically all the A.C. without introducing a long time constant, and combining the D.C. outputs for application to a D.C. amplifier that, in turn, operates an electronic loop current switch.

It is, therefore, a principal object of this invention to provide a highly efficient rectifier frequency shift keyer converter and filter circuit giving a square wave output without excessive A.C. ripple.

Another object is to provide such a converter circuit having improved noise balancing and minimized bias distortion.

A further object is to provide such an improved frequency shift keyer converter circuit employing only a few low cost components and providing performance equal to the best of many pre-existing more elaborate circuits.

Features of this invention useful in accomplishing the above objects include two parallel audio tuned circuits having a high step up ratio transformer input for driving from relatively low impedance circuitry to high impedance circuitry and with the transformers being series connected between the input from a limiter and a B+ voltage supply. Each of the parallel tuned circuits includes an LC tuned network connected across the secondary of the respective input transformer. One of the tuned circuits is tuned to a mark frequency of 2425 c.p.s. and the other is tuned to a space frequency of 1575 c.p.s. The A.C. tuned signal of each of the transformer input coupled tuned parallel circuits is applied to two voltage doublers in each parallel tuned circuit in a back-to-back arrangement with ground potential reference at the center. Both voltage doublers, in each respective parallel tuned circuit, have substantially equal and opposite A.C. ripple in their outputs coupled through A.C. signal coupling capacitors to substantially cancel each other out in the output combining circuit network. With the D.C. output of the two back-to-back voltage doublers in each parallel tuned circuit opposite in polarity one is blocked by the A.C. coupling capacitor to the output while the other is provided with a D.C. signal path through a resistor connected in parallel with the A.C. signal coupling capacitor of the respective voltage doubler. Whenever a signal input at the tuned frequency of a parallel circuit is sensed a signal output is provided from that parallel circuit consistent with the prechosen polarity of the D.C. path for that particular parallel circuit. These D.C. resistive signal paths for the two parallel circuits are so positioned as to provide a positive output with one of the parallel circuits and a minus D.C. output with the other of the tuned circuits.

A specific embodiment representing what is presently regarded as the best mode of carrying out the invention is illustrated in the accompanying drawing.

Figure 2:
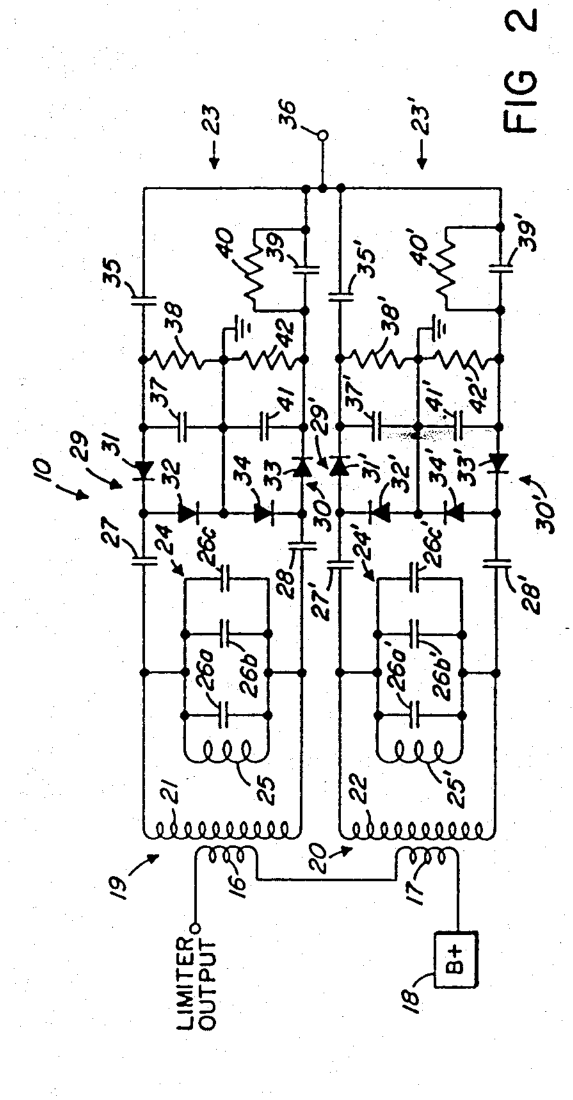

In the drawing:

FIGURE 1 represents a block diagram of equipment used for actuating teletype teleprinters from an RF receiver or teletype signal transmission line to a teleprinter and including a block representing applicants' novel rectifier frequency shift keyer converter and filter circuit; and, FIGURE 2, a schematic of applicants' rectifier frequency shift keyer (FSK) converter and filter circuit.

Referring to the drawing:

Applicants' rectifier frequency shift keyer (FSK) converter and filter circuit 10 is shown in FIGURE 1 to be a circuit in the signal path of teletype signal receiving and actuating equipment. The signal path includes an RF receiver or transmisson line 11 connected for passing a signal input to audio amplifier and limiter 12 (and/or discriminator circuit) with an output connection for an output fed to applicants' rectifier frequency shift keyer converter and filter circuit 10. The output of this circuit is then amplified through a D.C. amplifier 13 and applied to an electronic switch 14 controlling a teletype loop to the teleprinter 15.

Referring to FIGURE 2, the output of the limiter 12 is shown to be connected serially through primary coils 16 and 17 to a B+ voltage supply 18. Transformer primary coils 16 and 17 are the input coils of high ratio step up transformers 19 and 20, respectively. The transformer secondary coils 21 and 22 are connected to apply the input signals inductively coupled thereto from the primary coils 16 and 17, respectively, to parallel audio frequency tuned circuits 23 and 23'. In order that the description of applicants' circuit may be more readily understood, components substantially the same in parallel audio tuned frequency circuit 23' as those in the audio tuned frequency circuit 23 will be given primed numbers corresponding to the similar components. Much of the descriptive material relative to the circuit 23 is equally applicable to the other parallel circuit 23'. The opposite ends of transformer secondary coil 21 are connected to a parallel coil and capacitor tuned subcircuit 24 including coil 25 and capacitors 26*a*, 26*b*, and 26*c*.

The opposite ends of secondary coil 21 are also connected through A.C. coupling capacitors 27 and 28 to two back-to-back voltage doublers 29 and 30, respectively, with a ground potential reference connection at the center. Capacitor 27 is connected to the common junction of the cathode of diode 31 and the anode of diode 32, and the capacitor 28 is connected to the common junction of the anode of diode 33 and the cathode of diode 34. The cathode of diode 32 and the anode of diode 34 are connected to ground to provide the center ground connection between the voltage doublers 29 and 30. The anode of diode 31 is connected through an A.C. coupling capacitor 35 to D.C. signal output terminal 36. The anode of diode 31 is also connected through capacitor 37 and resistor 38 in parallel to ground. The cathode of diode 33 is connected through an A.C. coupling capacitor 39, having substantially the same capacity as capacitor 35, and through parallel connected resistor 40 to D.C. signal output terminal 36. The cathode of diode 33 is also connected through capacitor 41 and resistor 42 in parallel to ground.

In the corresponding parallel audio frequency tuned circuit 23′ the corresponding diodes 31′ and 32′, 34′ and 33′ are all reversed anode for cathode from the orientation of their counterparts in audio frequency tuned circuit 23 and the other components remain in the same corresponding relation in the circuit 23′ as in the parallel circuit 23. With the orientation of diodes 31, 32, 33, and 34 of the voltage doublers 29 and 30 and an appropriate tuned input signal a negative D.C. potential is developed on the upper line which is blocked by capacitor 35. However, the positive D.C. potential output developed through voltage doubler 30 on the lower line is passed through resistor 40 around the parallel connected capacitor 39 to the output terminal 36. With the shown orientation of the diodes in the parallel circuit 23′ voltage doubler 29′, with an appropriate tuned input signal, develops a positive D.C. potential on the top line of that circuit blocked from output terminal 36 by capacitor 35′, and the voltage doubler 30′ develops a negative D.C. potential which is passed through resistor 40′ to the output terminal 36. It should be noted that the diodes 31′, 32′, 33′ and 34′ could be reversed cathode for anode from the orientation shown in the parallel audio frequency tuned circuit 23′ and the resistor 40′ could be connected in parallel with capacitor 35′ to provide substantially the same overall operational results. Furthermore, the same reversal of diodes, cathode for anode, and the corresponding repositioning of resistor 40 could give these same operational results with the audio frequency tuned circuit 23.

A quite important feature of applicants' rectifier frequency shift keyer converter and filter circuit 10 is the fact that AC ripple out of each of the two back-to-back voltage doublers in each of the two parallel audio frequency tuned circuits 23 and 23′ is substantially equal and passed by the capacitors 35 and 39 and in the other parallel circuit capacitors 35′ and 39′ to substantially cancel each other out in the output combined network circuitry. This beneficial cancellation of AC ripple is also equally applicable to substantially all noise passed by the voltage doublers and through the output capacitors of each of the parallel circuits 23 and 23′.

Components and values used in a rectifier frequency shift keyer (FSK) converter and filter circuit constructed according to applicants' teaching include the following:

| | |
|---|---|
| Transformer 19 secondary 21 to primary coil 16 and transformer 20 secondary 22 to primary coil 17 turn ratios | 200:1 |
| B+ voltage supply 18 ____ volts | 28 |
| Coil 25 ____ mh | 50 |
| Capacitors 26*a*, 26*b*, and 26*c* total approximately ____ μf | 0.09 |
| To provide a tuned sub-circuit 24 tuned to ____ c.p.s. | 2425 |
| Coil 25′ ____ mh | 72 |
| Capacitors 26*a*′, 26*b*′ and 26*c*′ total approximately ____ μf | 0.15 |
| To provide a tuned sub-circuit 24′ tuned to ____ c.p.s. | 1575 |
| Capacitors 27, 27′, 28, and 28′ ____ μf | 0.01 |
| Diodes 31, 32, 33, 34, 31′, 32′ 33′, and 34′ | 1N270 |
| Capacitors 35, 35′ 39, and 39′ ____ μf | 0.01 |
| Capacitors 37, 37′, 41, and 41′ ____ pf | 4700 |
| Resistors 38, 38′, 42, and 42′ ____ ohms | 100K |
| Resistors 40 and 40′ ____ ohms | 47K |

Typical voltage values obtained in a circuit using such components and values are substantially:

| | Volts |
|---|---|
| Voltage across transformer secondary with signal frequency the same as tuned circuit frequency | 8.0 |
| Ripple voltage following rectifiers | 0.85 |
| Ripple voltage at the combined output | 0.07 |
| D.C. voltage at combined output | 4.5 |

To reiterate the circuits desired and provided by the applicants is a rectifier-filter circuit capable of taking two predetermined tuned frequency AC inputs from a discriminator, converting the signals to D.C. filtering out practically all AC without the introduction of a long time constant, and combining D.C. outputs for application to a D.C. amplifier in turn operating an electronic loop current switch for teleprinter equipment. The D.C. output of the FSK circuit is a square wave changing in polarity to plus or minus as the input tones to the discriminator change frequency between the predetermined frequencies of two tuned sub-circuits. The circuit avoids the requirement for long time constant filtering, in eliminating AC ripple, which, if used, would round off corners of the square wave and result in a distorted output. AC generated ripple is so suppressed as to eliminate accidental ripple peak tripping of the electronic switch following the D.C. amplifier. The predetermined audio tones are normally applied one at a time to the primaries of the two transformers.

It should be noted that the transformers in a working embodiment provide a high step up ratio to facilitate being driven from a low impedance circuit of approximately 100 ohms to a high characteristic impedance circuit of approximately 1,200,000 ohms. A tuned sub-circuit is connected across each secondary winding with one tuned to a mark frequency of 2425 c.p.s. and the other to a space frequency of 1575 c.p.s. The AC output of each of the transformer input tuned circuit combinations is applied in each of the parallel circuits to a double voltage doubler connected in back-to-back configuration with the common center connection to ground. The two back-to-back voltage doublers have substantially equal and opposite AC ripple in their outputs that is self cancelled out in the output combining network. The D.C. output developed by each of the two back-to-back voltage doublers in each parallel circuit is opposite in polarity one from the other. One of the two D.C. outputs of each of the parallel circuits is blocked with a series capacitor so that the combined output is either plus or minus depending on which polarity is blocked. In the mark tuned circuit the positive output is blocked and in the space tuned circuit the negative output is blocked. The resulting activated output of the two parallel networks is tied together at a common output terminal and applied to the input stage of the D.C. input amplifier.

Whereas this invention is here illustrated and described with respect to a specific embodiment thereof, it should be realized that various changes may be made without departing from the essential contribution to the art made by the teachings hereof.

We claim:

1. In a rectifier-filter circuit: signal input coupling means; a tuned sub-circuit having dual AC signal output paths; two voltage doublers, with a diode cathode to anode connection between the two doublers in common with a voltage potential reference connection; means coupling said voltage doublers for receiving inputs, respectively, from said dual AC signal output paths; each voltage doubler being provided with an AC signal coupling capacitor for connection to a common output means; and one of the voltage doublers being provided with D.C. circuit output path means connected in parallel with one of the AC signal coupling capacitors to said common output means.

2. The rectifier-filter circuit of claim 1, wherein said tuned sub-circuit is an LC tuned network having dual opposite signal output paths.

3. The rectifier-filter circuit of claim 2, wherein the voltage doublers include together four series connected diodes with the potential reference connection being between the interconnected cathode of one of the diodes and the anode of another of the diodes; and with the voltage potential reference connection being a connection to ground between the two voltage doublers.

4. The rectifier-filter circuit of claim 3, wherein said D.C. circuit output path means is a resistor connected in parallel with one of the AC signal coupling capacitors providing an AC signal coupling connection with said common output means.

5. The rectifier-filter circuit of claim 4, wherein a capacitor and resistor are connected in parallel between the anode of a diode of one voltage doubler and ground; and a capacitor and resistor are connected in parallel between the cathode of a diode of the other voltage doubler and ground.

6. The rectifier-filter circuit of claim 3, wherein said means coupling said voltage doublers for receiving inputs, respectively, from said dual signal output paths includes an AC signal coupling capacitor in each of the dual AC signal output paths.

7. In a rectifier frequency shift keyer converter and filter circuit: two rectifier-filter tuned frequency responsive circuits each provided with, AC signal input coupling means, a tuned sub-circuit having dual AC signal output paths, two voltage doublers, with a diode cathode to anode connection between the two doublers in common with a voltage potential reference connection, means coupling said voltage doublers for receiving inputs, respectively, from said dual AC signal output paths, each voltage doubler being provided with an AC signal coupling capacitor for connection to a common output means; and one of the voltage doublers of each rectifier-filter circuit being provided with D.C. circuit output path means connected in parallel with one of the AC signal coupling capacitors to said common output means of the respective rectifier-filter circuit.

8. The rectifier frequency shift keyer converter and filter circuit of claim 7, wherein the common output means of each of the two rectifier-filter tuned frequency responsive circuits are interconnected with common output terminal means.

9. The rectifier frequency shift keyer converter and filter circuit of claim 8, wherein the AC signal input coupling means for each of the two rectifier-filter tuned frequency responsive circuits includes AC signal coupling transformers, with primary coil windings connected to an AC signal input source, and secondary windings having opposite connections with the respective tuned sub-circuits and respective dual AC signal output paths of each of the two tuned frequency rectifier-filter responsive circuits.

10. The rectifier frequency shift keyer converter and filter circuit of claim 9, wherein the AC signal coupling transformer primary coils are series connected between the AC signal input source and a voltage supply.

11. The rectifier frequency shift keyer converter and filter circuit of claim 9, wherein the voltage doublers of each of the two rectifier-filter tuned frequency responsive circuits include together four series connected diodes with the potential reference connection being between the interconnected cathode of one of the diodes and the anode of another of the diodes; and with the voltage potential reference being a connection to ground between the two voltage doublers in each rectifier-filter tuned frequency responsive circuit.

12. The rectifier frequency shift keyer converter and filter circuit of claim 11, wherein the said D.C. circuit output path means of each of the rectifier-filter tuned frequency responsive circuits is a resistor in each connected in parallel with one of the AC signal coupling capacitors providing an AC signal coupling connection with the common output means of the respective rectifier-filter circuits.

13. The rectifier frequency shift keyer converter and filter circuit of claim 12, wherein the D.C. circuit output path resistor of the two rectifier-filter tuned frequency responsive circuits are connected to provide a D.C. output of one polarity in one rectifier-filter tuned frequency responsive circuit and a D.C. output of the opposite polarity in the other rectifier-filter tuned frequency responsive circuit.

14. The rectifier frequency shift keyer converter and filter circuit of claim 13, wherein the tuned sub-circuit of each rectifier-filter tuned frequency responsive circuit is an LC tuned network having dual opposite signal output paths.

References Cited

UNITED STATES PATENTS

| | | | |
|---|---|---|---|
| 2,969,468 | 1/1961 | Hogue | 328—140 X |
| 3,017,464 | 1/1962 | Boughtwood et al. | 328—140 X |
| 3,341,782 | 9/1967 | Aemmes | 329—112 |

JOHN S. HEYMAN, *Primary Examiner.*

U.S. Cl. X.R.

329—112; 307—233; 328—167